(12) United States Patent
Nam

(10) Patent No.: US 9,293,443 B2
(45) Date of Patent: Mar. 22, 2016

(54) CHIP STACK PACKAGES, METHODS OF FABRICATING THE SAME, ELECTRONIC SYSTEMS INCLUDING THE SAME AND MEMORY CARDS INCLUDING THE SAME

(71) Applicant: SK hynix Inc., Icheon (KR)

(72) Inventor: Jong Hyun Nam, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/288,305

(22) Filed: May 27, 2014

(65) Prior Publication Data

US 2015/0194410 A1    Jul. 9, 2015

(30) Foreign Application Priority Data

Jan. 6, 2014    (KR) .......................... 10-2014-0001341

(51) Int. Cl.
*H01L 25/00* (2006.01)
*H01L 25/065* (2006.01)
*H01L 23/00* (2006.01)

(52) U.S. Cl.
CPC ............ *H01L 25/0657* (2013.01); *H01L 24/32* (2013.01); *H01L 2224/05554* (2013.01); *H01L 2224/32145* (2013.01); *H01L 2224/48091* (2013.01); *H01L 2224/48227* (2013.01); *H01L 2224/49175* (2013.01); *H01L 2224/73265* (2013.01); *H01L 2225/0651* (2013.01); *H01L 2225/06555* (2013.01); *H01L 2225/06562* (2013.01)

(58) Field of Classification Search
CPC .................................................. H01L 25/0657
See application file for complete search history.

(56) References Cited

U.S. PATENT DOCUMENTS

| 2011/0163458 | A1* | 7/2011 | Tsukano | 257/777 |
| 2013/0270717 | A1* | 10/2013 | Ko et al. | 257/777 |

FOREIGN PATENT DOCUMENTS

KR    10-2013-0064839 A    6/2013

* cited by examiner

*Primary Examiner* — Matthew Reames

(57) ABSTRACT

A chip stack package includes a first chip disposed over a substrate, a second chip disposed over the first chip and having an overhang, and a first supporter attached to a bottom surface of the overhang of the second chip and a sidewall of the first chip. The overhang of the second chip protrudes from the sidewall of the first chip.

18 Claims, 15 Drawing Sheets

CHIP STACK PACKAGES, METHODS OF FABRICATING THE SAME, ELECTRONIC SYSTEMS INCLUDING THE SAME AND MEMORY CARDS INCLUDING THE SAME

CROSS-REFERENCE TO RELATED APPLICATION

The present application claims priority under 35 U.S.C 119(a) to Korean Application No. 10-2014-0001341, filed on Jan. 6, 2014, in the Korean Intellectual Property Office, and is incorporated herein by reference in its entirety.

BACKGROUND

1. Technical Field

Embodiments of the present disclosure relate to semiconductor packages and, more particularly, to chip stack packages, methods of fabricating the same, electronic systems including the same and memory cards including the same.

2. Related Art

With the development of smaller, faster, multi-functional and higher performance portable electronic devices, small, thin and light semiconductor packages are increasingly desirable in the electronics industry. In general, a semiconductor package may include a single semiconductor chip. Recently, however, a chip stack package has been developed to include a plurality of stacked semiconductor chips, which perform different functions, in order to implement high performance electronics devices.

A plurality of stacked semiconductor chips in each chip stack package may have substantially the same size or different sizes. When the semiconductor chips in each chip stack package have substantially the same size, an upper semiconductor chip may be stacked over a lower semiconductor chip such that two chips cross each other. When the semiconductor chips in each chip stack package have different sizes, an upper semiconductor chip may have a greater size than that of a lower semiconductor chip, may be stacked over the lower semiconductor chip. In both cases, the upper semiconductor chip may have at least one overhang. The overhanging portion, which protrudes from an underlying sidewall of the lower semiconductor chip, is defined as an overhang and will be referred to as such hereafter. Since such an overhang of the upper semiconductor chip is not supported by the lower semiconductor chip, when a force is exerted on the overhang, the overhang is prone to deflections. Accordingly, the overhang of the upper semiconductor chip may cause some failures during fabrication of the chip stack package.

SUMMARY

Various embodiments are directed to chip stack packages, methods of fabricating the same, electronic systems including the same and memory cards including the same.

According to some embodiments, a chip stack package includes a first chip disposed over a substrate, a second chip disposed over the first chip and including an overhang, the overhang protruding past a sidewall of the first chip, and a first supporter attached to a bottom surface of the overhang of the second chip and the sidewall of the first chip.

According to further embodiments, a method of fabricating a chip stack package includes forming a first stack structure including a first chip disposed over a second chip, the second chip having an overhang, and a first supporter attached to a portion of a first surface of the second chip corresponding to the overhang and a sidewall of the first chip, the overhang of the second chip protruding from the sidewall of the first chip, and attaching the first stack structure to a substrate such that the second chip is disposed over the first chip.

According to further embodiments, an electronic system includes a memory and a controller coupled to the memory through a bus. The memory or the controller includes a first chip disposed over a substrate, a second chip disposed over the first chip and including an overhang, the overhang protruding past a sidewall of the first chip, and a first supporter attached to a bottom surface of the overhang of the second chip and the sidewall of the first chip.

According to further embodiments, a memory card includes a memory and a memory controller configured to control an operation of the memory. The memory includes a first chip disposed over a substrate, a second chip disposed over the first chip and including an overhang, the overhang protruding past a sidewall of the first chip, and a first supporter attached to a bottom surface of the overhang of the second chip and the sidewall of the first chip.

BRIEF DESCRIPTION OF THE DRAWINGS

Embodiments of the present disclosure will become more apparent in view of the attached drawings and accompanying detailed description, in which.

DESCRIPTION OF SPECIFIC EMBODIMENTS

Figure 1:
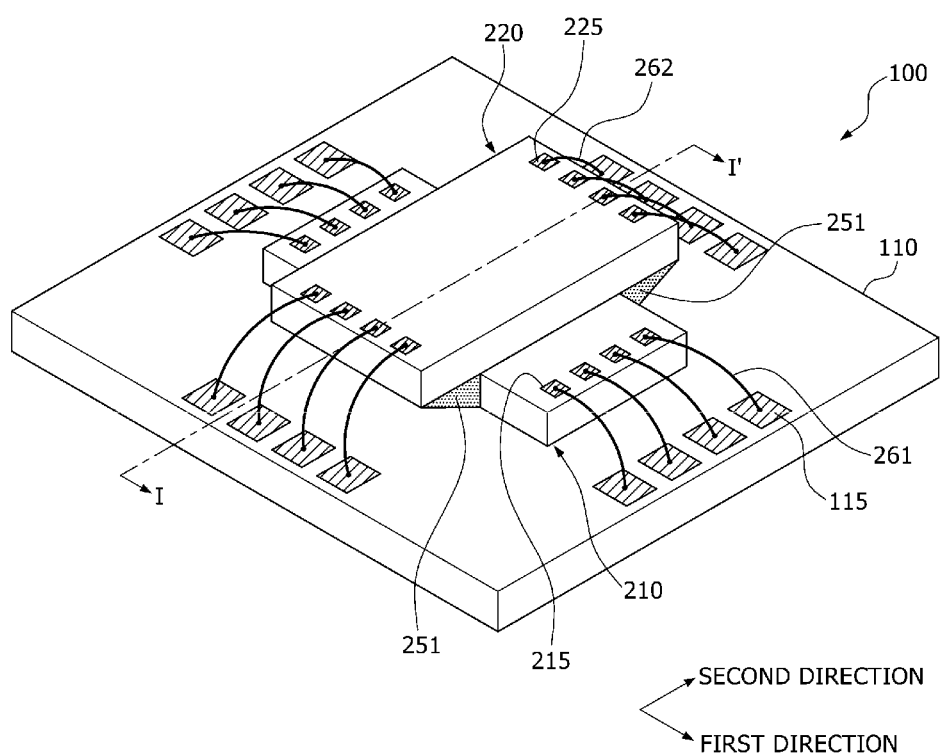
FIG. 1 is a perspective view illustrating a chip stack package according to an embodiment of the present disclosure.

In chip stack packages, semiconductor chips (hereinafter, referred to as 'chips') included in each chip stack package are stacked such that chip pads of the chips are connected to bonding pads of a package substrate. For example, an upper chip stacked on a lower chip may have an overhang, which protrudes from an underlying sidewall of the lower chip. In order to expose chip pads of the upper chip, these chip pads may be disposed on the overhang of the upper chip. However, during a wire bonding process to form bonding wires connecting between the chip pads and the bonding pads, a force may be applied to the chip pads on the overhang of the upper chip. In an embodiment, a support layer may be attached to a bottom surface of an overhang of an upper chip and a sidewall of a lower chip. In addition, a support layer may be attached to a top surface of an overhang of a lower chip and a sidewall of an upper chip disposed on the lower chip. Thus, the support layer adhered to the overhang may suppress deflection of the overhang when a force is applied to the overhang.

It will be understood that although the terms first, second, third etc. may be used herein to describe various elements, these elements should not be limited by these terms. These terms are used to distinguish one element from another element. Thus, a first element in some embodiments could be termed a second element in other embodiments without departing from the teachings herein.

It will also be understood that when an element is referred to as being "on," "above," "below," "under", "beside" or "in" another element, it can be directly "on," "above," "below," "under", "beside" or "in" the other element, respectively, or intervening elements may also be present. It will be further understood that when an element or layer is referred to as being "connected to" or "coupled to" another element or layer, the element or layer may be directly connected or coupled to the other element or layer, or intervening elements or layers may be present. In contrast, when an element is referred to as being "directly connected to" or "directly coupled to" another element or layer, no intervening elements or layers are present. Other words used to describe the relationship between elements or layers should be interpreted in a like fashion (e.g., "between" versus "directly between," "adjacent" versus "directly adjacent," "on" versus "directly on"). Chips may be obtained by separating a wafer including integrated circuits into a plurality of pieces using a die sawing process.

The chips may correspond to memory chips, logic chips, analog chips, or chips combining the functions thereof. The memory chips may include dynamic random access memory (DRAM) circuits, static random access memory (SRAM) circuits, flash circuits, magneto-resistive random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chip or analog chips may include logic circuits or analog circuits, respectively, which are integrated on and/or in the semiconductor substrate. In some cases, the term "semiconductor substrate" or "substrate" used herein may be construed as a semiconductor chip or a semiconductor die in which integrated circuits are formed.

Referring to FIG. 1, a chip stack package 100 according to an embodiment may include a substrate 110 having bonding pads 115 and first and second chips 210 and 220 stacked on the substrate 110. Although FIG. 1 illustrates the bonding pads 115 disposed on four edges of the substrate 110, other configurations are possible. The first chip 210 may be the same type as the second chip 220. However, in some embodiments, the first chip 210 may be a different type from the second chip 220. The first chip 210 may be stacked on an upper surface of the substrate 110, and the second chip 220 may be stacked on a surface of the first chip 210 opposite to the substrate 110. Each of the first and second chips 210 and 220 may have a width in one direction and a length, which is greater than the width, in another direction perpendicular to the one direction.

The first and second chips 210 and 220 may be disposed to cross each other viewed from top to bottom, or plan view. In some embodiments, the first chip 210 and the second chip 220 may be disposed such that the first chip 210 and the second chip 220 longitudinally extend in a first direction and in a second direction, respectively. In these embodiments, the first direction may be substantially perpendicular to the second direction. However, in other embodiments, the first direction and second direction form a non-right angle. Because the first and second chips 210 and 220 are stacked to cross each other as described above, both end portions of the first chip 210 in the first direction protrude from underlying sidewalls of the second chip 220. Both end portions of the second chip 220 in the second direction may protrude from underlying sidewalls of the first chip 210.

Although not shown in the drawings, the first chip 210 may be attached to the substrate 110 using an adhesive layer. Similarly, the second chip 220 may be attached to the first chip 210 using an adhesive layer. Chip pads 215 may be disposed on the end portions of the first chip 210 along both edges of the first chip 210 extending in the second direction. The chip pads 215 of the first chip 210 may be electrically connected to corresponding bonding pads 115 on the substrate 110 using first wires 261. Chip pads 225 may be disposed on the end portions of the second chip 220 along both edges of the second chip 220 extending in the first direction. The chip pads 225 of the second chip 220 may be electrically connected to the corresponding bonding pads 115 on the substrate 110 using second wires 262. Each of first supporters 251 may be attached to the corresponding bottom surfaces of the protruded end portions (or overhangs) of the second chip 220, which extend in the first direction.

Figure 2:
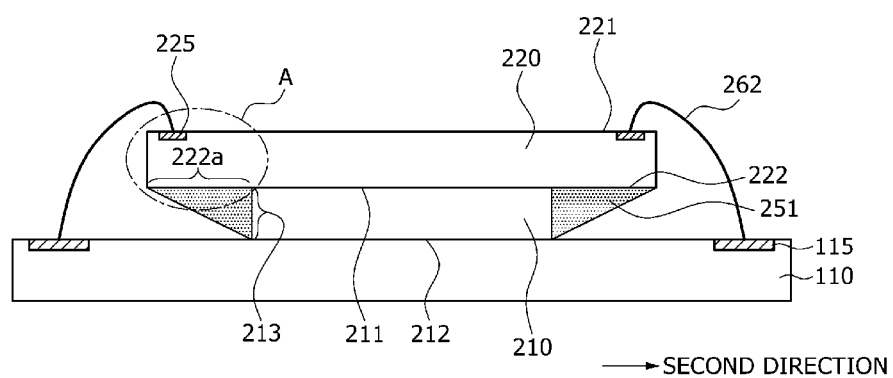
FIG. 2 is a cross-sectional view taken along a line I-I' of FIG. 1.
Figure 3:
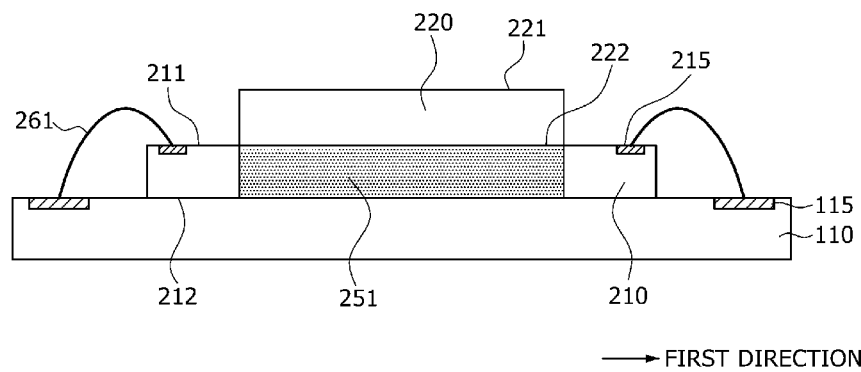
FIG. 3 is a side view of the chip stack package shown in FIG. 1.

Referring to FIGS. 1, 2 and 3, a bottom surface 212 of the first chip 210 may be attached to the substrate 110. A bottom surface 222 of the second chip 220 may be attached to a top surface 211 of the first chip 210. As described with reference to FIG. 1, both end portions of the first chip 210 on which the chip pads 215 are disposed may protrude from the overlying sidewalls of the second chip 220. Since a substantially entire bottom surface of the first chip 210 is attached to the substrate 110, the first chip 210 may be fully supported by the substrate 110. In contrast, both end portions of the second chip 220 on which the chip pads 225 are disposed may protrude past the sidewalls of the first chip 210, thereby providing a pair of overhangs 'A' (see FIG. 2). These overhangs 'A' may be prone to damage resulting from various process factors, for example, a force which is applied thereto during a wire bonding process. However, according to an embodiment, the first supporters 251 may be attached to the corresponding bottom surfaces 222a of the overhangs 'A' to suppress damage and/or deformation of the overhangs 'A' when forces are applied to the overhangs 'A'.

The first supporters 251 may be attached to corresponding sidewalls 213 of the first chip 210 in addition to the bottom surfaces 222a of the overhangs 'A'. The sidewalls 213 of the first chip 210 contacting the first supporters 251 are adjacent to the overhangs 'A'. When a force is applied to the overhang 'A,' the first supporter 251 may suppress damage and/or deformation of the overhang 'A' using adhesive strength between the first supporter 251 and the sidewall 213 of the first chip 210 as well as between the first supporter 251 and the bottom surface 222a of the overhang 'A' of the second chip 220. In particular, a combined structure including the overhang 'A' of the second chip 220 and the first supporter 251 has greater bending resistance than that of the overhang 'A' alone. As a result, a deflection of the overhang 'A' in the combined structure resulting from an external bending moment on the overhang 'A' may be reduced compared to that before forming of the first supporter 251.

In some embodiments, a first supporter 251 may have a thickness that varies along the second direction. For example, as shown in FIG. 2, the thickness of the first supporter 251 linearly increases from an end of the second chip 220 to the sidewall 213 of the first chip 210. In an embodiment, the thickness of the first supporter 251 on the attached sidewall 213 of the first chip 210 may be substantially equal to a thickness of the first chip 210. In another embodiment, the thickness of the first supporters 251 on the attached sidewalls 213 of the first chip 210 may be less than the thickness of the first chip 210. According to an embodiment shown in FIG. 2, the first supporter 251 covers substantially all of entire bottom surface 222a of the overhang 'A'. However, in some embodiments, the first supporter 251 may partially cover the bottom surface 222a of the overhang 'A' such that a portion of the bottom surface 222a proximate to an end sidewall of the second chip 220 is exposed. In other words, although the figures show edges of the first supporters 251 extending to edges of the first and second chips 210 and 220, in other embodiments, edges of the first supporters 251 may not extend all the way to edges of the chips. The first supporters 251 may longitudinally extend in the first direction.

The first supporters 251 may include an insulation material. In some embodiments, the first supporters 251 may include an epoxy type material. Alternatively, the first supporters 251 may include a silicon-based material. In some embodiments, the first supporters 251 may include a material having substantially the same coefficient of thermal expansion (CTE) as the first and second chips 210 and 220. During a manufacturing process, the first supporter 251, the first chip 210, and the second chip 220 may expand or shrink according to a variation in temperature. When the first supporter 251 has a different CTE from that of the second chip 220, the temperature variation causes the first supporter 251 to expand or shrink by a different length from the second chip 220. Depending on the difference in the CTEs, a compressive or a tensile force is generated at the bottom surface 222a of the second chip 220 between the first supporter 251 and the second chip 220. This force may cause the overhang 'A' of the second chip 220 to deform, thereby damaging the chip stack package 100. Moreover, this force may deteriorate the adhesive strength at the bottom surface 222a between the overhang 'A' and the first supporter 251. Similarly, when the first supporter 251 has a different CTE from that of the first chip 220, the adhesive strength at the sidewall 213 of the first chip 210 may be deteriorated.

On the other hand, when the first supporter 251 has a CTE which is substantially equal to that of the first and second chips 210 and 220, warpage or deformation of the overhang 'A' of the second chip 220 may be reduced. Further, if the first supporter 251 has substantially the same CTE as the first and second chips 210 and 220, the adhesive strength between the first supporter 251 and the first chip 210 and that between the first supporter 251 and the second chip 220 may be reduced.

In some embodiments, the first supporters 251 may be formed by coating an insulation material using an ink-jet process or a printing process. Alternatively, the first supporters 251 may be formed using a dispensing process.

FIGS. 4 to 8 are schematic views illustrating a chip stack package according to an embodiment. In FIGS. 4 to 8, the same reference numerals as used in FIGS. 1 to 3 denote the same elements.

Figure 4:
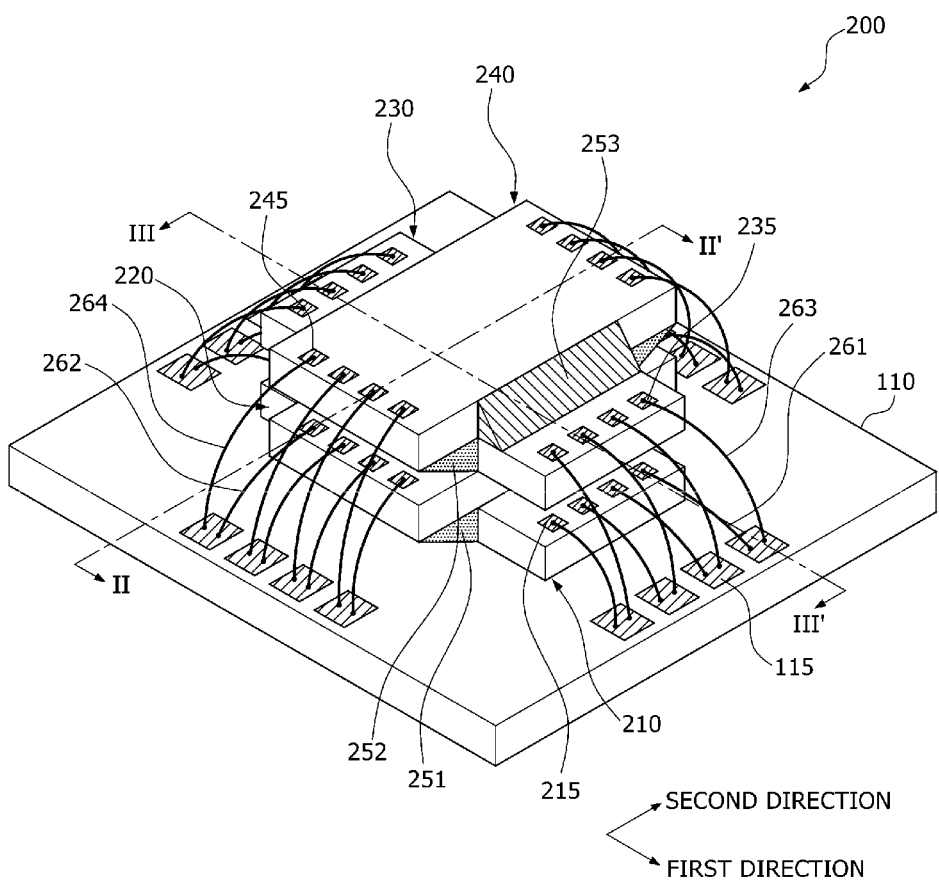
FIG. 4 is a perspective view illustrating a chip stack package according to an embodiment of the present disclosure.

Referring to FIG. 4, a chip stack package 200 according to an embodiment may include a substrate 110 having bonding pads 115 and first to fourth chips 210, 220, 230 and 240 sequentially stacked on the substrate 110. Although FIG. 4 illustrates the bonding pads 115 disposed on four edges of the substrate 110, but embodiments are not limited thereto. For example, in some embodiments, the bonding pads 115 may be disposed to have a different configuration from FIG. 4. The first to fourth chips 210, 220, 230 and 240 may have the same configuration. However, in some embodiments, at least one of the first to fourth chips 210, 220, 230 and 240 may be a different type from the other chips. Each of the first to fourth chips 210, 220, 230 and 240 may have a width in one direction and a length, which is greater than the width, in another direction perpendicular to the one direction.

The second chip 220 may be disposed to cross the first chip 210 when viewed from a top plan view, and the third chip 230 may be disposed to cross the second chip 220. In addition, the fourth chip 240 may also be disposed to cross the third chip 230. That is, the first and third chips 210 and 230 may be disposed such that the first and third chips 210 and 230 longitudinally extend in a first direction. The second and fourth chips 220 and 240 may be disposed such that the second and fourth chips 220 and 240 longitudinally extend in a second direction. In an embodiment, the second direction is substantially perpendicular to the first direction. However, in some embodiments, the first and second directions form an oblique angle. When the second and fourth chips 220 and 240 cross the first and third chips 210 and 230, both end portions of the second chip 220 in the second direction protrude from underlying sidewalls of the first chip 210 and overlying sidewalls of the third chip 230. Similarly, both end portions of the third chip 230 in the first direction may protrude from sidewalls of the second and fourth chips 220 and 240. Both end portions of the fourth chip 240 in the second direction may protrude from underlying sidewalls of the third chip 230.

Although not shown in the drawings, the first chip 210 may be attached to the substrate 110 using an adhesive layer and the second chip 220 may be attached to the first chip 21 using an adhesive layer. Similarly, the third chip 230 may be attached to the second chip 220 using an adhesive layer and the fourth chip 240 may be attached to the third chip 230 using an adhesive layer. Chip pads 215 may be disposed on both end portions of the first chip 210 along both edges of the first chip 210 extending in the second direction. The chip pads 215 of the first chip 210 may be electrically connected to the bonding pads 115 of the substrate 110 through first wires 261. Chip pads 225 may be disposed on both end portions of the second chip 220 along both edges of the second chip 220 extending in the first direction. The chip pads 225 of the second chip 220 may be electrically connected to the bonding pads 115 of the substrate 110 through second wires 262. Chip pads 235 may be disposed on both end portions of the third chip 230 along both edges of the third chip 230 extending in the second direction. The chip pads 235 of the third chip 230 may be electrically connected to the bonding pads 115 of the substrate 110 through third wires 263. Chip pads 245 may be disposed on both end portions of the fourth chip 240 along both edges of the fourth chip 240 extending in the first direction. The chip pads 245 of the fourth chip 240 may be electrically connected to the bonding pads 115 of the substrate 110 through fourth wires 264.

A pair of first supporters 251, each of which extends in the first direction, may be attached to corresponding bottom surfaces of both overhangs of the second chip 220. A first supporter 251 may be attached to the sidewall of the first chip 210 and the bottom surface of the second chip 220. A pair of second supporters 252, each of which extends in the first direction, may be attached to corresponding bottom surfaces of both overhangs of the fourth chip 240. Each of the second supporters 252 may be attached to the sidewall of the third chip 230 and the bottom surface of the fourth chip 240. A pair of third supporters 253, each of which extends in the second direction, may be attached to corresponding top surfaces of both overhangs of the third chip 230. Each of the third supporters 253 may be attached to the sidewall of the fourth chip 240 and the top surface of the third chip 230.

Figure 5:
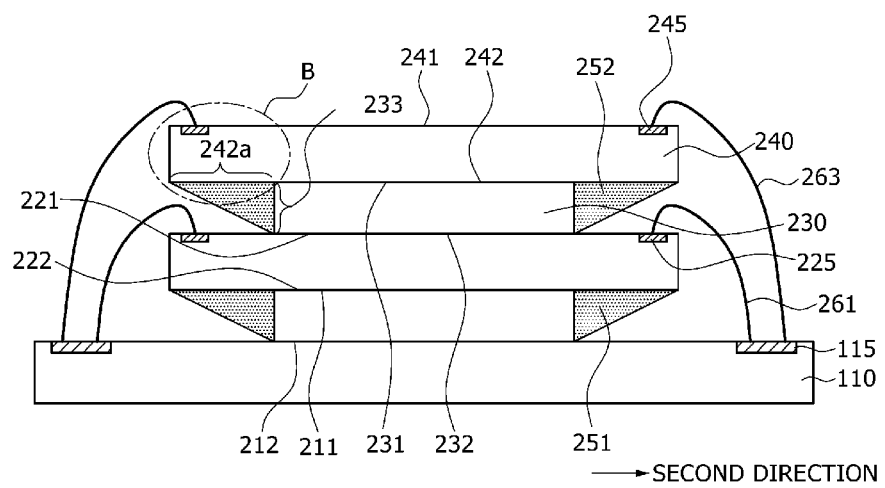
FIG. 5 is a cross-sectional view taken along a line II-II' of FIG. 4.
Figure 6:
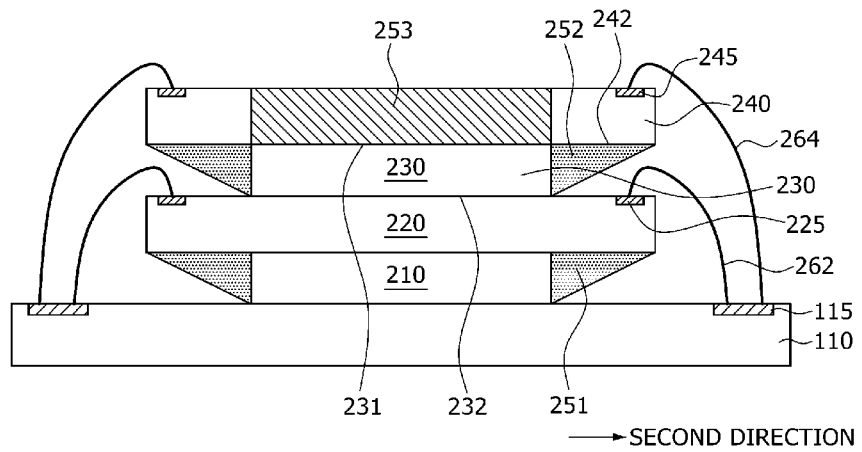
FIG. 6 is a side view of the chip stack package shown in FIG. 4.

Referring to FIGS. 4, 5 and 6, a bottom surface 212 of the first chip 210 may be attached to the substrate 110. A bottom surface 222 of the second chip 220 may be attached to a top surface 211 of the first chip 210. A top surface 221 of the second chip 220 may be attached to a bottom surface 232 of the third chip 230. A bottom surface 242 of the fourth chip 240 may be attached to a top surface 231 of the third chip 230. As described with reference to FIG. 4, both end portions of the first chip 210 on which the chip pads 215 are disposed may protrude from the overlying sidewalls of the second chip 220. However, a substantially entire bottom surface of the first chip 210 is attached to the substrate 110. Thus, the first chip 210 may be fully supported by the substrate 110. In contrast, both end portions of the second chip 220 on which the chip pads 225 are disposed may protrude from the underlying sidewalls of the first chip 210, thereby providing a pair of overhangs. These overhangs of the second chip 220 may be supported by the first supporters 251, which are attached to the sidewalls of the first chip 210 and the bottom surfaces of the overhangs of the second chip 220. The first supporters 251 illustrated in FIGS. 4, 5, and 6 may have the substantially same configuration as the first supporters 251 illustrated in FIGS. 1, 2, and 3.

Both end portions of the fourth chip 240 on which the chip pads 245 are disposed may protrude from the underlying sidewalls of the third chip 230, thereby providing a pair of overhangs 'B' (see FIG. 5). A pair of second supporters 252 may be attached to corresponding bottom surfaces 242a of the overhangs 'B' to suppress damage and/or deformation of the overhangs 'B' when forces are applied to the overhangs 'B'. The second supporters 252 may also be attached to corresponding sidewalls 233 of the third chip 230 in addition to the bottom surfaces 242a of the overhangs 'B'.

The sidewalls 233 of the third chip 230 contacting the second supporters 252 are adjacent to the overhangs 'B'. When a force is applied to the overhang 'B,' the second supporters 252 may suppress damage or deformation of the overhangs 'B'. A combined structure including the overhang 'B' of the fourth chip 240 and the second supporter 252 has greater bending resistance than that of the overhang 'B' alone. As a result, a deflection of the overhang 'B' in the combined structure resulting from an external bending moment on the overhang 'B' may be reduced compared to that before the second supporter 252 is formed.

In some embodiments, the second supporters 252 may have a thickness profile, which varies along the second direction. For example, as shown in FIG. 5, the thickness of the second supporter 252 gradually increases from the end surface of the fourth chip 240 to the sidewall 233 of the third chip 230. In an embodiment, the thickness of the second supporter 252 on the attached sidewall 233 of the third chip 230 may be substantially equal to a thickness of the third chip 230. Alternatively, the thickness of the second supporters 252 on the sidewalls 233 of the third chip 230 may be less than the thickness of the third chip 230. According to an embodiment shown in FIG. 5, the second supporter 252 is disposed to cover the substantially entire bottom surface 242a of the overhang 'B'. However, in some embodiments, the second supporter 252 may partially cover the bottom surface 242a of the overhang 'B' such that a portion of the bottom surface 242a of the fourth chip 240 is exposed. In other words, edges of the second supporters 252 may not extend to edges of the chips. The second supporters 252 longitudinally extend in the first direction.

The second supporters 252 may include an insulation material. In some embodiments, the second supporters 252 may include an epoxy type material. Alternatively, the second supporters 252 may include a silicon-based material. In some embodiments, the second supporters 252 may include a material having substantially the same CTE as the third and fourth chips 230 and 240. As discussed above, using materials with the same or similar CTEs may reduce stresses when temperatures change.

In some embodiments, the second supporters 252 may be formed by coating an insulation material using an ink-jet process or a printing process. Alternatively, the second supporters 252 may be formed using a dispensing process.

Figure 7:
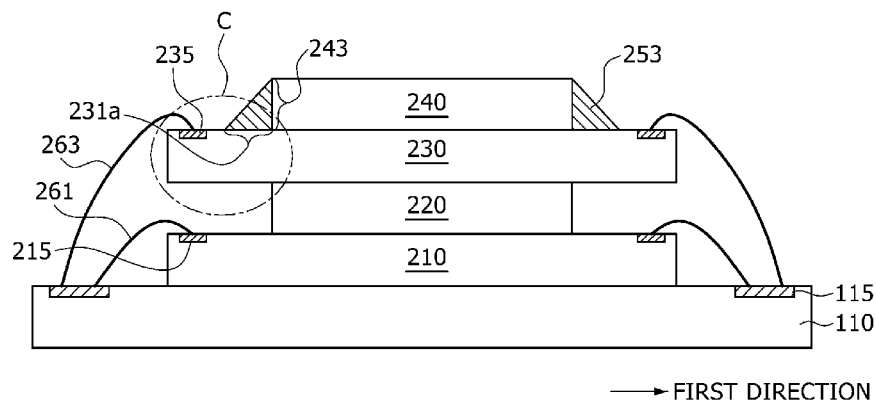
FIG. 7 is a cross-sectional view taken along a line III-III' of FIG. 4.
Figure 8:
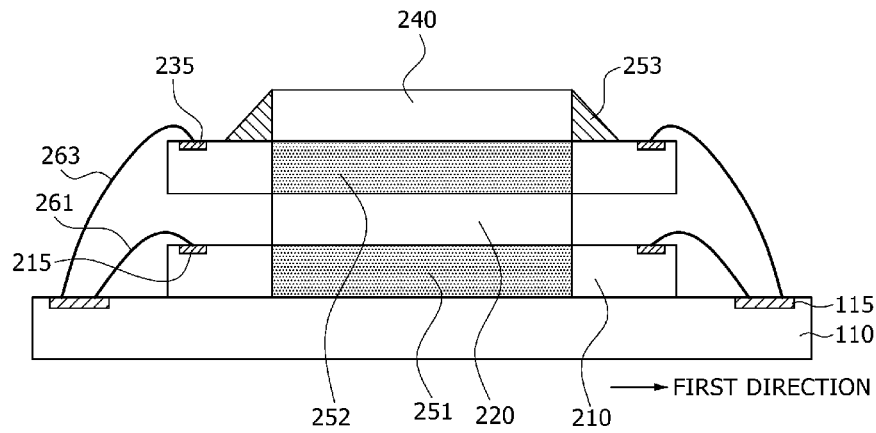
FIG. 8 is a side view of the chip stack package shown in FIG. 4, which corresponds to looking along a second direction.

Referring to FIGS. 4, 7 and 8, both end portions of the third chip 230 on which the chip pads 235 are disposed protrude from the underlying sidewalls of the second chip 220, thereby providing a pair of overhangs 'C' (see FIG. 7). The overhangs 'C' may be supported by the third supporters 253 which are attached to sidewalls of the fourth chip 240 and top surfaces of the overhanging portion 'C' of the third chip 230. As a result, the chip pads 235 disposed on the remaining portion of the top surface of the overhang 'C' are exposed to be electrically coupled to the bonding pads 115 using the third wires 263. In more detail, each of the third supporters 253 may be attached to a top surface 231a of the overhang 'C' of the third chip 230 and a sidewall 243 of the fourth chip 240. The third supporters 253 are attached to portions of the top surfaces 231a of the overhangs 'C' to expose the chip pads 235 of the third chip 230. The sidewall 243 of the fourth chip 240 contacting the third supporter 253 is adjacent to the overhang 'C'.

The third supporters 253 may include an insulation material. In some embodiments, the third supporters 253 may include an epoxy type material. Alternatively, the third supporters 253 may include a silicon-based material.

In some embodiments, the third supporters 253 may include a material having substantially the same CTE as the third and fourth chips 230 and 240. Benefits of the third supporter 253 having the material whose CTE value is substantially the same as that of the third and fourth chips are similar to the beneficial aspects described above with respect to the first and second supporters 251 and 252. Thus, detailed descriptions related to the beneficial aspects of the third supporter 253 will be omitted herein.

In some embodiments, the third supporters 253 may be formed by coating an insulation material using an ink-jet process or a printing process. Alternatively, the third supporters 253 may be formed using a dispensing process.

In some embodiments, each of the third supporters 253 may have a thickness profile which varies along the first direction. For example, as shown in FIG. 7, the thickness of the third supporter 253 gradually increases as it approaches the sidewall 243 of the fourth chip 240. In an embodiment, the thickness of the third supporters 253 on the attached sidewalls 243 of the fourth chip 240 may be substantially equal to a thickness of the fourth chip 240. The third supporters 253 longitudinally extend in the second direction. The third supporters 253 may support the overhangs 'C' of the third chip 230 using adhesive strengths between the third supporters 253 and the third chip 230 as well as between the third supporters 253 and the fourth chip 240. Thus, when a force is applied to the overhang 'C,' the third supporters 253 adhered to the overhangs 'C' may suppress damage and/or deformation of the overhangs 'C.

FIGS. 9, 11, 13, 15 and 18 are plan views illustrating a method of fabricating a chip stack package according to some embodiments. FIGS. 10 and 12 are cross-sectional views taken along a line IV-IV' of FIGS. 9 and 11, respectively.

Figure 13:
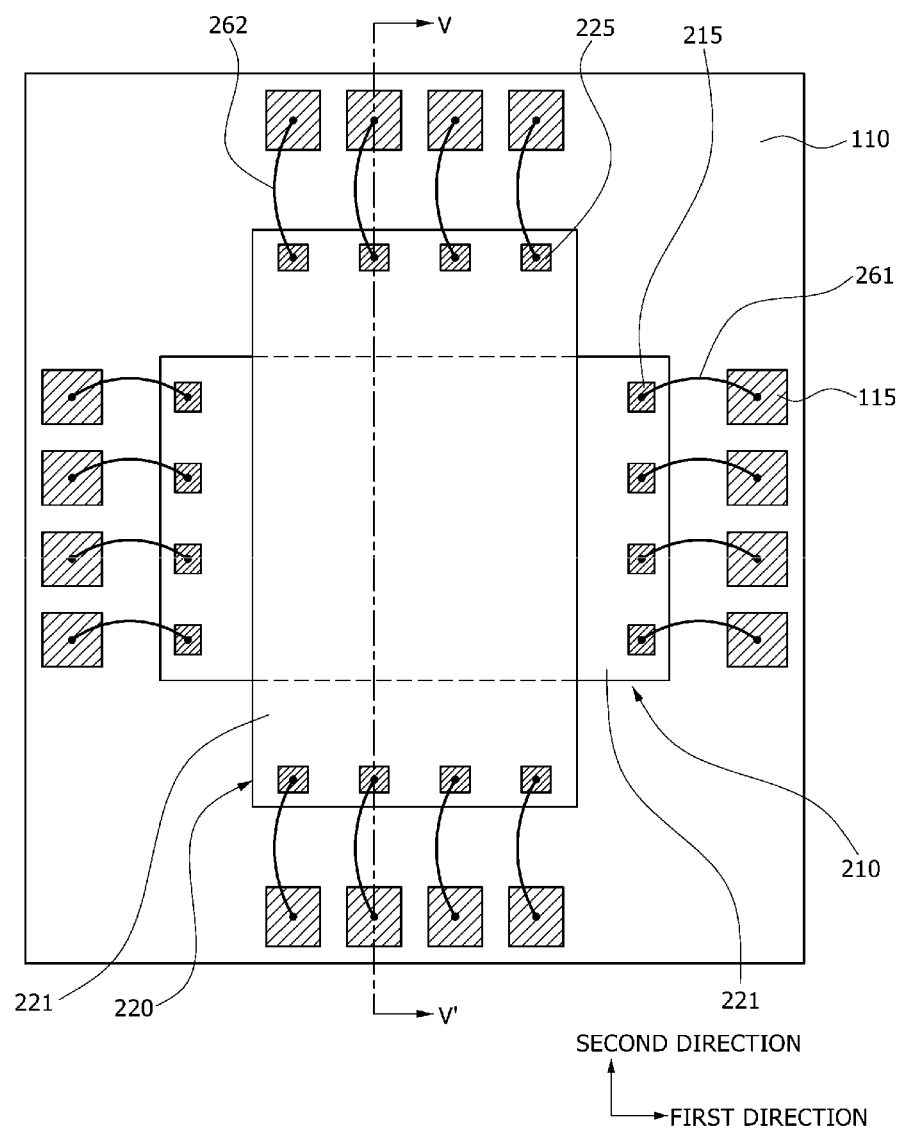
Figure 14:
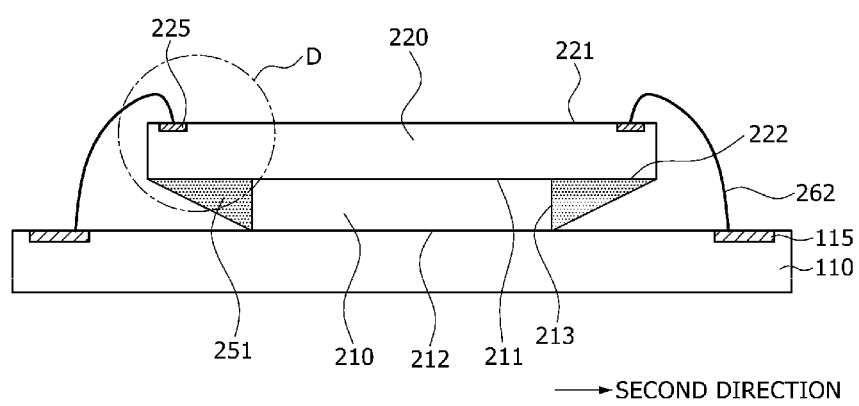
Figure 15:
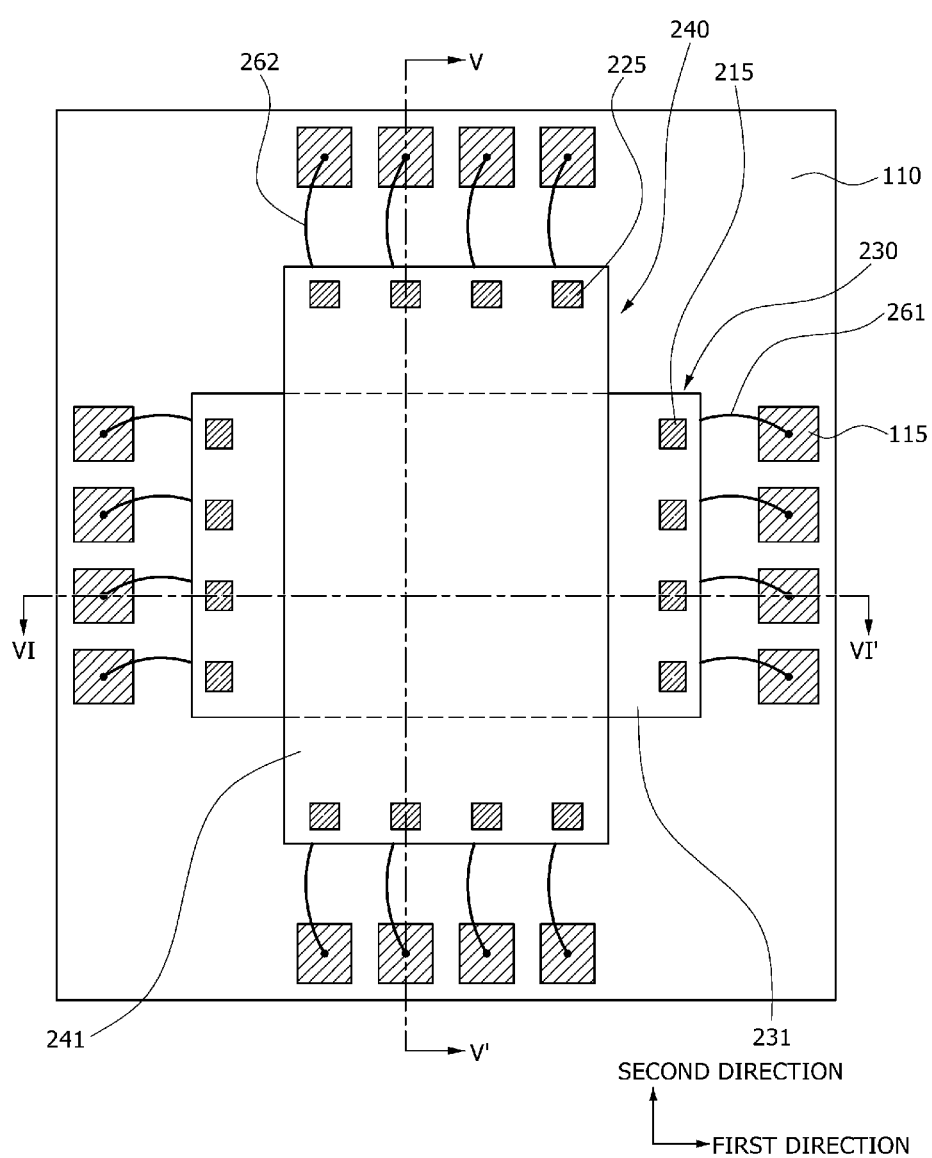
Figure 16:
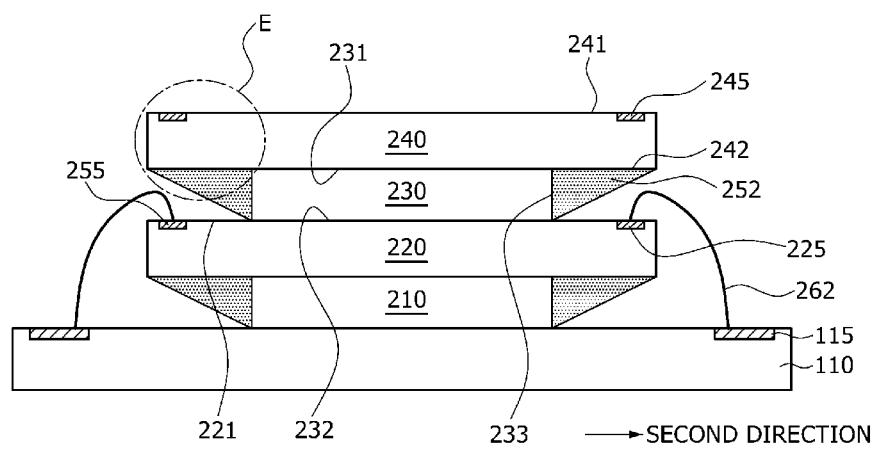
Figure 17:
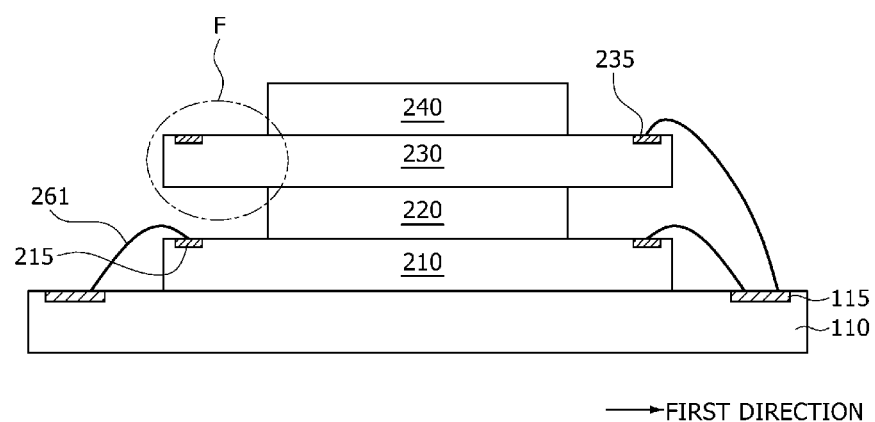
Figure 18:
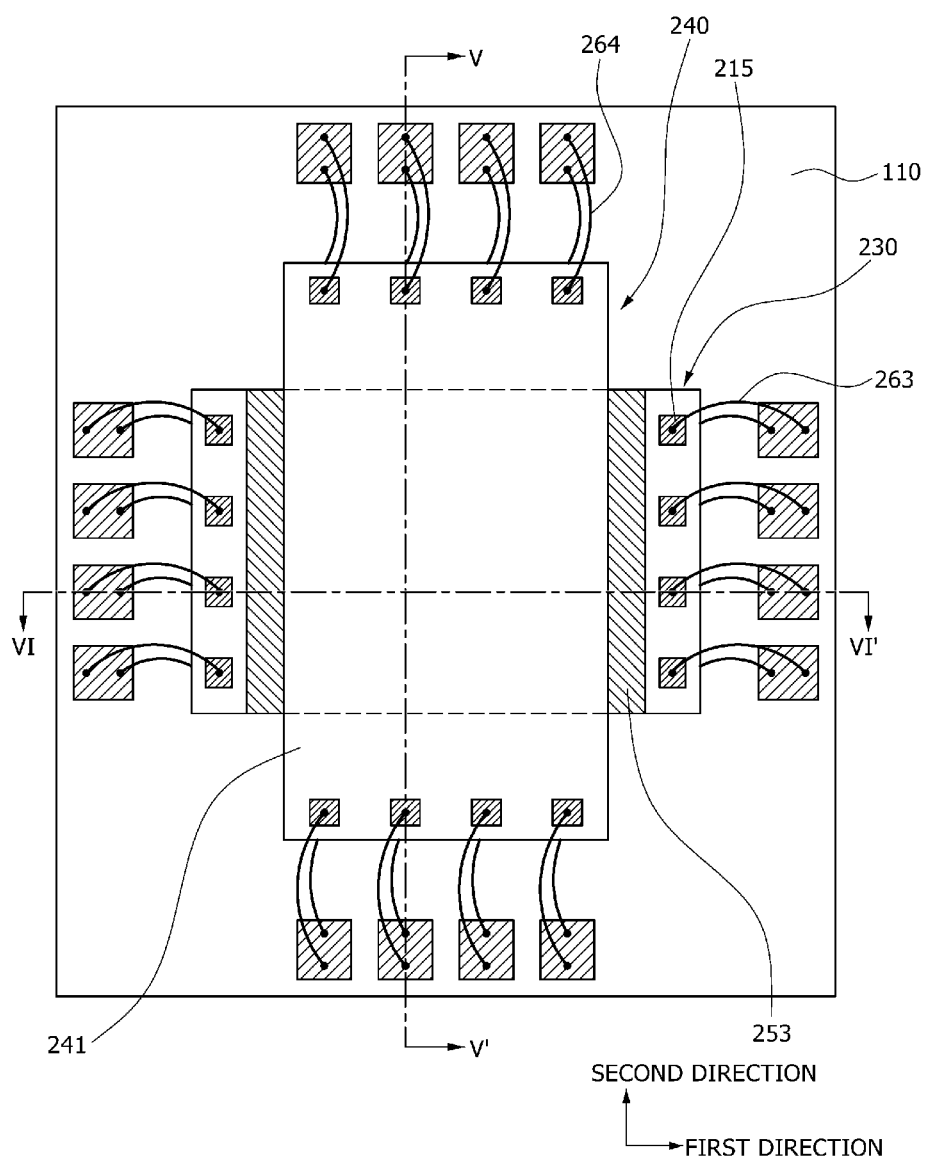
Figure 19:
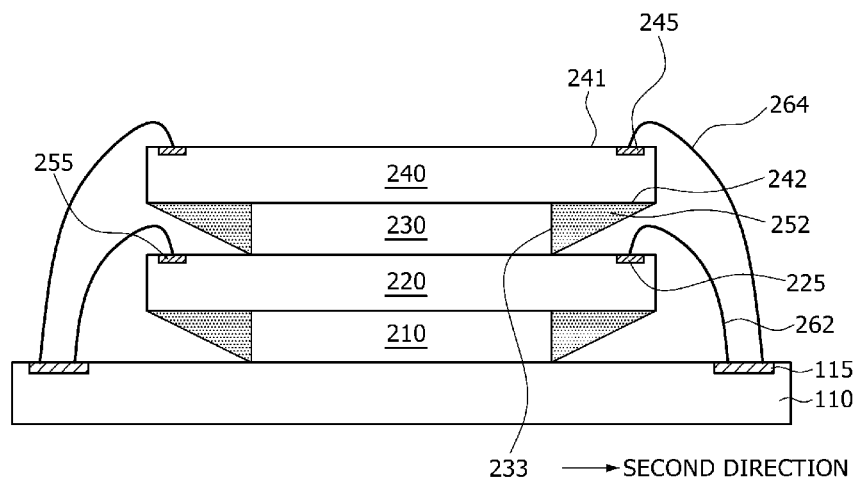
Figure 20:
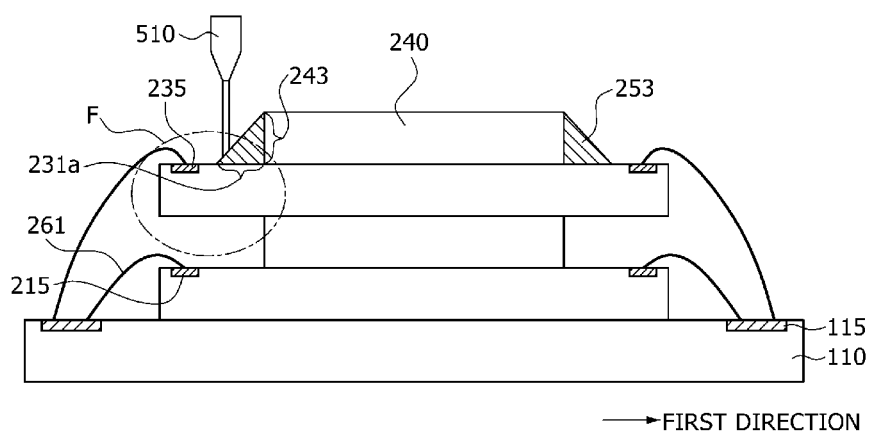

FIGS. 14, 16 and 19 are cross-sectional views taken along a line V-V' of FIGS. 13, 15 and 18, respectively. FIGS. 17 and 20 are cross-sectional views taken along a line VI-VI' of FIGS. 15 and 18, respectively.

Figure 9:
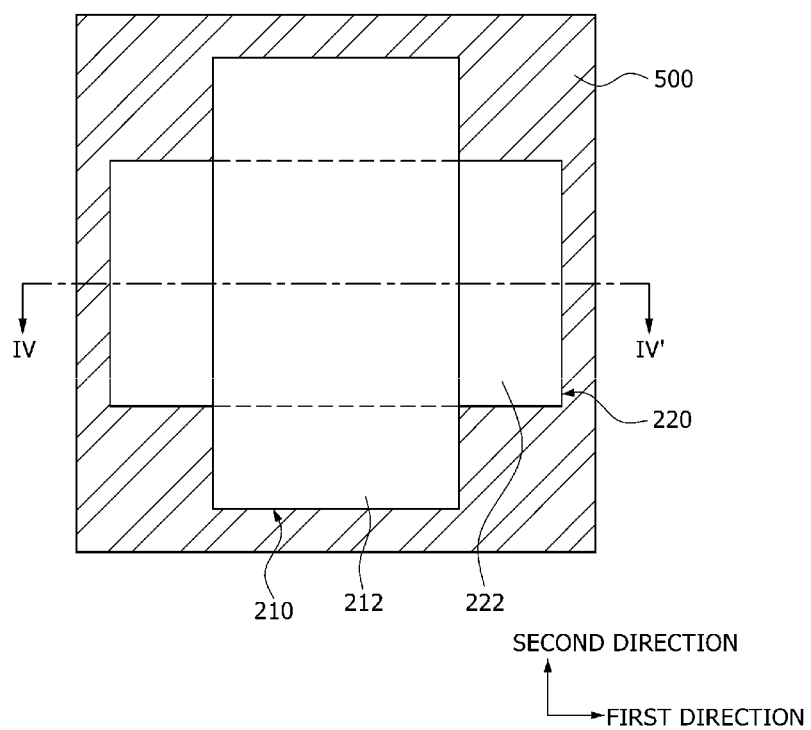
FIGS. 9 to 20 illustrate a method of fabricating a chip stack package according to embodiments of the present disclosure.
Figure 10:
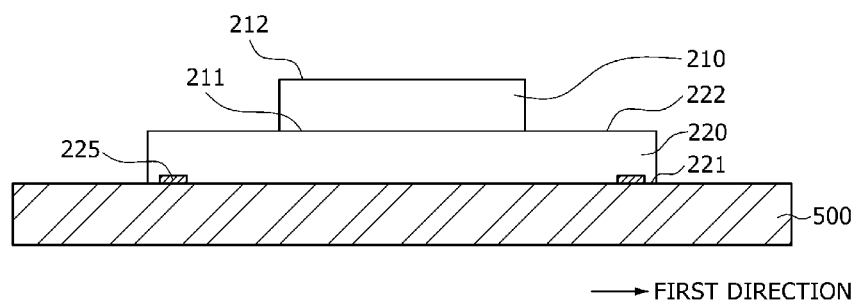

Referring to FIGS. 9 and 10, a second chip 220 may be attached to a carrier 500. In some embodiments, the carrier 500 may act as a temporary substrate for handling chips before the chips are disposed on a different substrate, as will be described below. For example, the carrier 500 may be a tape-shaped substrate. The second chip 220 may have a first surface 221 and a second surface 222 which are opposite to each other. Chip pads 225 may be disposed on the first surface 221 of the second chip 220. The first surface 221 of the second chip 220 including the chip pads 225 may be attached to the carrier 500.

Although not shown in the drawings, the second chip 220 may be attached to a surface of the carrier 500 using an adhesive agent. The adhesive agent may lose its adhesive strength if ultraviolet (UV) rays are irradiated onto the adhesive agent. Thus, after irradiating UV rays in a subsequent process, the second chip 220 may be easily detached from the carrier 500. The second chip 220 may be attached to the carrier 500 such that the second chip 220 longitudinally extends in a first direction.

A first chip 210 may be attached to the second surface 222 of the second chip 220. The first chip 210 may have a first surface 211 and a second surface 212 which are opposite to each other. The first surface 211 of the first chip 210 may be attached to the second surface 222 of the second chip 220. In some embodiments, the first chip 210 may be attached to the second chip 220 such that the first chip 210 crosses the second chip 220, as illustrated in the plan view of FIG. 9. The first chip 210 is disposed such that the first chip 210 and the second chip 220 longitudinally extend in the second direction and the first direction, respectively. In an embodiment, the second direction is perpendicular to the first direction. The first and second chips 210 and 220 may cross each other at various angles in different embodiments. In these embodiments, both end portions of the second chip 220 in the first direction may protrude from overlying sidewalls of the first chip 210. Both end portions of the first chip 210 in the second direction may protrude from underlying sidewalls of the second chip 220.

Figure 11:
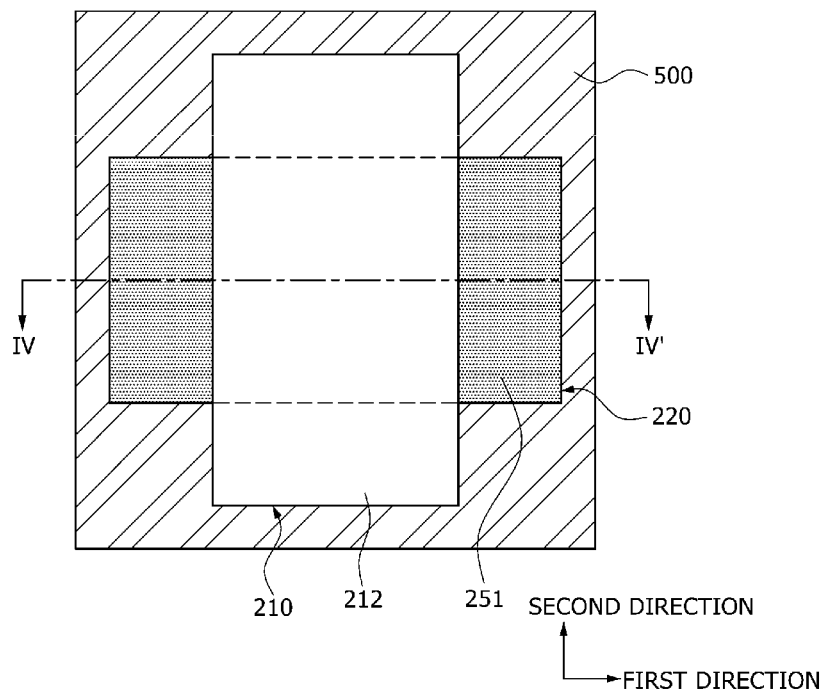
Figure 12:
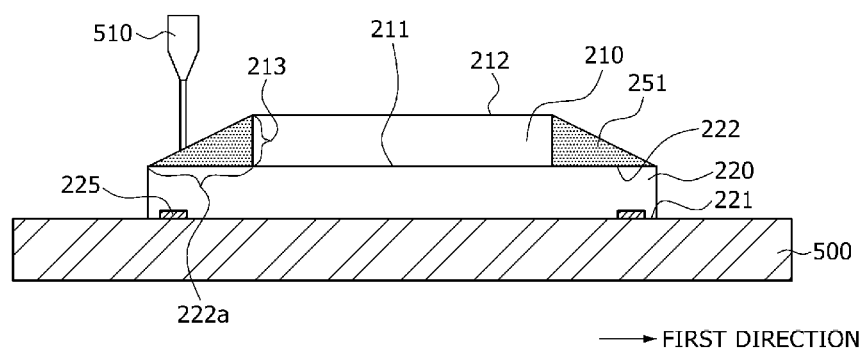

Referring to FIGS. 11 and 12, a pair of first supporters 251 may be formed on corresponding bottom surfaces 222 of both end portions of the second chip 220, which protrude from the overlying sidewalls 213 of the first chip 210. In some embodiments, the first supporters 251 may be formed by coating an insulation material on the protruded portion of the second surfaces 222 of the second chip 220 using an ink-jet nozzle 510. Subsequently, the coated insulation material may be cured at a predetermined temperature.

Alternatively, the insulation material of the first supporters 251 may be coated using a printing process or a dispensing process. The insulation material of the first supporters 251 may include an epoxy type material or a silicon-based material. The first supporters 251 may be formed to cover the substantially entire surface 222a of an overhang of the second chip 220, as illustrated in FIG. 12. The first supporter 251 may have various thickness profiles according to embodiments, as described above with respect to the first supporter 251 with reference to FIG. 2. The first supporters 251 may longitudinally extend in the second direction.

Referring to FIGS. 13 and 14, after the first supporters 251 are formed, the first and second chips 210 and 220 may be detached from the carrier 500 of FIGS. 11 and 12. Subsequently, a stack structure of the first and second chips 210 and 220 may be attached to a substrate 110, such that the first chip 210 may be attached to the substrate 110. As a result, the substrate 110 may be attached to the bottom surface 212 of the first chip 210 and the bottom surface 222 of the second chip 220 may be attached to the top surface 211 of the first chip 210. The first chip 210 may be disposed to longitudinally extend in the first direction and the second chip 220 may be disposed to longitudinally extend in the second direction, so that the first and second chips 210 and 220 cross each other. Subsequently, first wires 261 may be formed to electrically connect the chip pads 215 of the first chip 210 to bonding pads 115 of the substrate 110, and second wires 262 may be formed to electrically connect the chip pads 225 of the second chip 220 to the bonding pads 115 of the substrate 110. The first and second wires 261 and 262 may be formed using a wire bonding process.

The wire bonding process may be performed using a threaded capillary, through which a wire is fed. During the wire bonding process, the capillary is lowered to contact a surface of the chip pad 225 to form the first and second wires 261 and 262, and thus a force may be applied to the chip pad 225. Since a substantially entire portion of the first chip 210 is supported by the substrate 110, the first chip 210 may not be significantly damaged or deformed during the wire bonding process. In contrast, the second chip 220 has overhangs 'D' (see FIG. 14) on which the chip pads 225 are disposed. Thus, when a force is applied to the overhang 'D' of the second chip 220 to form the second bonding wires 262, the overhang 'D' may excessively deflect to result in bonding failures. However, according to an embodiment, the first supporters 251 may be attached to the bottom surfaces of the overhangs 'D' to suppress the deflection or deformation of the overhangs 'D' during the wire bonding process. The first supporters 251 may support the overhangs 'D' using adhesive strengths between the first supporters 251 and the first chip 210 as well as between the first supporters 251 and the second chip 220. A combined structure including the overhang 'D' of the second chip 220 and the first supporter 251 has a greater bending resistance than that of the overhang 'D,' thereby reducing the deflection of the overhang 'D.'

Referring to FIGS. 15, 16, and 17, a stack structure including a third chip 230 and a fourth chip 240 may be formed using the same methods to form the stack structure including the first and second chips 210 and 220 as described with reference to FIGS. 9, 10, 11 and 12 above. Subsequently, the stack structure of the third and fourth chips 230 and 240 may be detached from a carrier, and the stack structure of the third and fourth chips 230 and 240 may be stacked on the second chip 220. As a result, a bottom surface 232 of the third chip 230 may be attached to the top surface 221 of the second chip 220 and a bottom surface 242 of the fourth chip 240 may be attached to a top surface 231 of the third chip 230. The third chip 230 may be disposed to longitudinally extend in the first direction like the first chip 210, and the fourth chip 240 crossing the third chip 230 may be disposed to longitudinally extend in the second direction like the second chip 220.

Since second supporters 252 may also be formed between the sidewalls 233 of the third chip 230 and bottom surfaces of overhangs 'E' (see FIG. 16) of the fourth chip 240. The second supporters 252 may be formed to have substantially the same material and/or shape as the first supporters 251. Thus, the overhangs 'E' of the fourth chip 240 may be supported by the second supporters 252. Both end portions of the third chip 230 protrude from underlying sidewalls of the second chip 220 (or from overlying sidewalls of the fourth chip 240), thereby providing a pair of overhangs 'E' (see FIG. 17).

Referring to FIGS. 18, 19 and 20, third supporters 253 may be formed on portions of top surfaces 231a of both end portions of the third chip 230, which protrude from the overlying sidewalls 243 of the fourth chip 240. In some embodiments, the third supporters 253 may be formed by coating an insulation material using an ink-jet nozzle 510. Alternatively, the insulation material for forming the third supporters 253 may be coated using a printing process or a dispensing process. The insulation material to form the third supporters 253 may include an epoxy type material or a silicon-based material.

The third supporters 253 may be formed to contact the portion of the top surfaces 231a of the overhangs 'F' of the third chip 230 and the sidewalls 243 of the fourth chip 240. The third supporter 253 is attached to the portion of the top surface 231a of the overhang 'F' to expose the remaining portion on which the chip pads 235 are disposed. The sidewalls 243 of the fourth chip 240 that contacts the third supporters 253 are adjacent to the overhangs 'F.' Thus, the sidewalls 243 of the fourth chip 240 contacting the third supporters 253 may vertically overlap with the third chip 230.

The third supporter 253 may be formed such that a thickness profile of third supporter 253 varies along the first direction. For example, the thickness of the third supporter 253 gradually increases as it approaches the sidewall 243 of the fourth chip 240. In an embodiment, the thickness of the third supporter 253 on the attached sidewall 243 of the fourth chip 240 may be substantially equal to a thickness of the fourth chip 240. In another embodiment, the thickness of the third supporter 253 of the attached sidewall 243 of the fourth chip is less than that of the fourth chip 240. The third supporters 253 may be formed to longitudinally extend in the second direction.

Subsequently, third wires 263 may be formed to electrically connect the chip pads 235 of the third chip 230 to the bonding pads 115 of the substrate 110, and fourth wires 264 may be formed to electrically connect the chip pads 245 of the fourth chip 240 to the bonding pads 115 of the substrate 110. The third and fourth wires 263 and 264 may be formed using a wire bonding process. During the wire bonding process, the overhangs 'F' of the third chip 230 may be supported by the third supporter 253 and the overhang 'E' (see FIG. 16) of the fourth chip 240 may be supported by the second supporter 252. That is, like the overhang 'D' of the second chip 220, the overhang 'F' of the third chip 230 may be supported by adhesive strength between the third supporter 253 and the third chip 230 and between the third supporter 253 and fourth chip 240. The overhang 'E' of the fourth chip 240 may be supported by adhesive strength between the second supporter 252 and the third chip 230 and between the second supporter 252 and fourth chip 240. Thus, when a force is applied to the overhang 'F' or 'E,' the third and second supporters 253 and 252 may suppress damage and/or deformation of the overhang 'F' or 'E.'

Embodiments of a chip stack package described above may be applied to various electronic systems.

Figure 21:
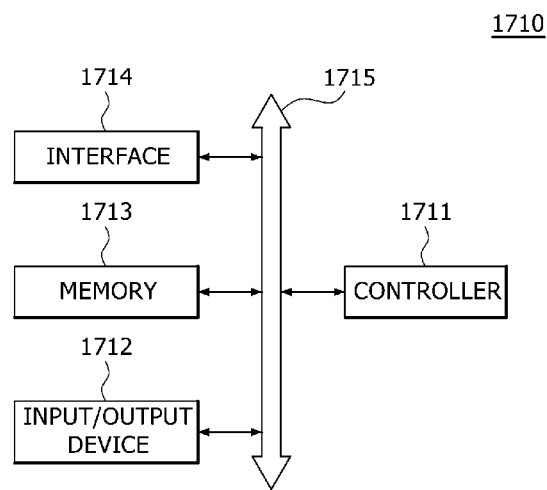
FIG. 21 is a block diagram illustrating an electronic system including a chip stack package according to an embodiment of the present disclosure.

Referring to FIG. 21, a chip stack package in accordance with an embodiment may be applied to an electronic system 1710. The electronic system 1710 may include a controller 1711, an input/output device 1712, and a memory 1713. The controller 1711, the input/output device 1712, and the memory 1713 may be coupled with one another through a bus 1715 providing a path through which data are transmitted and/or received.

In an embodiment, the controller 1711 may include one or more of a microprocessor, a digital signal processor, a microcontroller, and/or logic devices capable of performing the same functions as these components. The controller 1711 or the memory 1713 may include one or more of chip stack packages according to an embodiment of the present disclosure. The input/output device 1712 may include at least one selected among a keypad, a keyboard, a display device, a touch screen and so forth. The memory 1713 includes a device for storing data. The memory 1713 may store data and/or commands to be executed by the controller 1711, and the like.

The memory 1713 may include a volatile memory device such as a DRAM and/or a nonvolatile memory device such as a flash memory. In an embodiment, a flash memory may be mounted to an information processing system such as a mobile terminal or a desk top computer. The flash memory may constitute a solid state disk (SSD), and the electronic system 1710 may stably store a large amount of data in a flash memory system.

The electronic system 1710 may further include an interface 1714 suitable for transmitting and receiving data to and from a communication network. The interface 1714 may be a wired or wireless type, and may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 1710 is an equipment capable of performing wireless communication, the electronic system 1710 may be used in a communication system such as of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), and Wibro (wireless broadband Internet).

Figure 22:
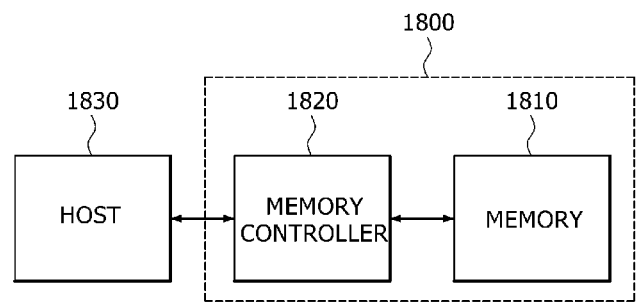
FIG. 22 is a block diagram illustrating another electronic system including a chip stack package according to an embodiment of the present disclosure.

Referring to FIG. 22, a chip stack package in accordance with an embodiment may be provided in a memory card 1800. For example, the memory card 1800 may include a memory 1810 such as a nonvolatile memory device and a memory controller 1820. The memory 1810 and the memory controller 1820 may store data or read stored data.

The memory 1810 may include at least one nonvolatile memory device in which the packaging technologies of the embodiments are employed. The memory controller 1820 may control the memory 1810 such that stored data is read out or data is stored in response to a read/write request from a host 1830.

Embodiments have been disclosed for illustrative purposes. Those skilled in the art will appreciate that various modifications, additions and substitutions are possible, without departing from the scope and spirit of the present disclosure and the accompanying claims.

What is claimed is:
1. A chip stack package comprising:
a first chip disposed over a substrate;
a second chip disposed over the first chip and including an overhang, the overhang protruding past a sidewall of the first chip; and
a first supporter attached to a bottom surface of the overhang of the second chip and the sidewall of the first chip,
wherein a thickness of the first supporter increases as it approaches the sidewall of the first chip, wherein the first supporter extends from the sidewall of the first chip to an end of the overhang, and wherein the first supporter is disposed on the substantially entire bottom surface of the overhang of the second chip.

2. The chip stack package of claim 1, wherein the first and second chips longitudinally extend in first and second directions, respectively, so that the first and second chips cross each other.

3. The chip stack package of claim 1, wherein the sidewall of the first chip is adjacent to the bottom surface of the overhang of the second chip.

4. The chip stack package of claim 2, wherein the thickness of the first supporter varies according to a distance from the sidewall of the first chip along the second direction.

5. The chip stack package of claim 4, wherein a thickness of a portion of the first supporter on the sidewall of the first chip is substantially equal to or less than a thickness of the first chip.

6. The chip stack package of claim 1, wherein the first supporter includes an insulation material.

7. The chip stack package of claim 1, wherein the first supporter includes an epoxy type material or a silicon-based material.

8. The chip stack package of claim 1, wherein the first supporter, the first chip, and the second chip have substantially the same coefficient of thermal expansion (CTE).

9. The chip stack package of claim 1, wherein the overhang of the second chip is a first overhang, further comprising:

a third chip disposed over the second chip and including a second overhang;

a fourth chip disposed over the third chip and including a third overhang;

a second supporter attached to a bottom surface of the third overhang of the fourth chip and a sidewall of the third chip; and a third supporter attached to a top surface of the second overhang of the third chip and a sidewall of the fourth chip.

10. The chip stack package of claim 9, wherein the sidewall of the third chip is adjacent to the bottom surface of the third overhang of the fourth chip.

11. The chip stack package of claim 9, wherein the second supporter longitudinally extends in a first direction and transversely extends in a second direction, and wherein a thickness of the second supporter varies with a distance from the sidewall of the third chip along the second direction.

12. The chip stack package of claim 9, wherein a thickness of the second supporter increases as it approaches the sidewall of the third chip from an end of the third overhang of the fourth chip.

13. The chip stack package of claim 12, wherein a thickness of the second supporter on the sidewall of the third chip is substantially equal to or less than a thickness of the third chip.

14. The chip stack package of claim 9, wherein the second supporter longitudinally extends in a first direction and transversely extends in a second direction from the sidewall of the third chip to an end of the third overhang of the fourth chip.

15. The chip stack package of claim 9, further comprising a plurality of chip pads exposed on a first portion of the top surface of the second overhang of the third chip, wherein the third supporter is attached to a second portion of the top surface of the second overhang of the third chip.

16. The chip stack package of claim 9, wherein the sidewall of the fourth chip is a sidewall adjacent to the second overhang of the third chip, among sidewalls of the fourth chip.

17. The chip stack package of claim 9, wherein the third supporter transversely extends in a first direction, and wherein a thickness of the third supporter increases as it approaches the sidewall of the fourth chip to which the third supporter is attached from an end portion of the second overhang of the third chip.

18. The chip stack package of claim 9, wherein a thickness of the third supporter on the sidewall of the fourth chip is substantially equal to or less than a thickness of the fourth chip.

* * * * *